United States Patent [19]
Eskildsen et al.

[11] Patent Number: 5,336,456
[45] Date of Patent: Aug. 9, 1994

[54] METHOD OF PRODUCING A SCRIBELINED LAYOUT STRUCTURE FOR PLASTIC ENCAPSULATED CIRCUITS

[75] Inventors: Steven R. Eskildsen, Folsom; Suresh V. Golwalkar, Orangevale; Tito Barrios, Sacramento, all of Calif.

[73] Assignee: Intel Corporation, Santa Clara, Calif.

[21] Appl. No.: 990,358

[22] Filed: Dec. 15, 1992

Related U.S. Application Data

[63] Continuation of Ser. No. 698,381, May 10, 1991.

[51] Int. Cl.⁵ .................. B29C 59/14; B29C 45/14
[52] U.S. Cl. ........................... 264/157; 264/265; 264/272.17; 264/274
[58] Field of Search ............ 264/274, 265, 328.9, 264/157, 220, 272.17; 156/643, 659.1, 663, 654; 437/207, 211, 219, 226, 227

[56] References Cited

U.S. PATENT DOCUMENTS

| | | | |
|---|---|---|---|
| 3,533,896 | 10/1970 | Hartig | 264/274 |
| 4,224,101 | 9/1980 | Tijburg et al. | 437/227 |
| 4,725,561 | 2/1988 | Haond et al. | 156/643 |
| 4,904,617 | 2/1990 | Muschke | 437/226 |
| 4,929,300 | 5/1990 | Wegleiter | 437/226 |
| 4,984,358 | 1/1991 | Nelson | 437/226 |
| 5,017,512 | 5/1991 | Takagi | 437/226 |
| 5,024,970 | 6/1991 | Mori | 437/226 |

Primary Examiner—Jan H. Silbaugh
Assistant Examiner—Angela Ortiz
Attorney, Agent, or Firm—Blakely Sokoloff Taylor & Zafman

[57] ABSTRACT

A method of producing surface features having topological variances in the scribeline areas of a wafer adjacent to the dies. Surface features are used to reduce fracturing of molding compound and to prevent movement of the molding compound with respect to the surface of a die in a plastic encapsulated integrated circuit.

4 Claims, 2 Drawing Sheets

FIG_1 (PRIOR ART)
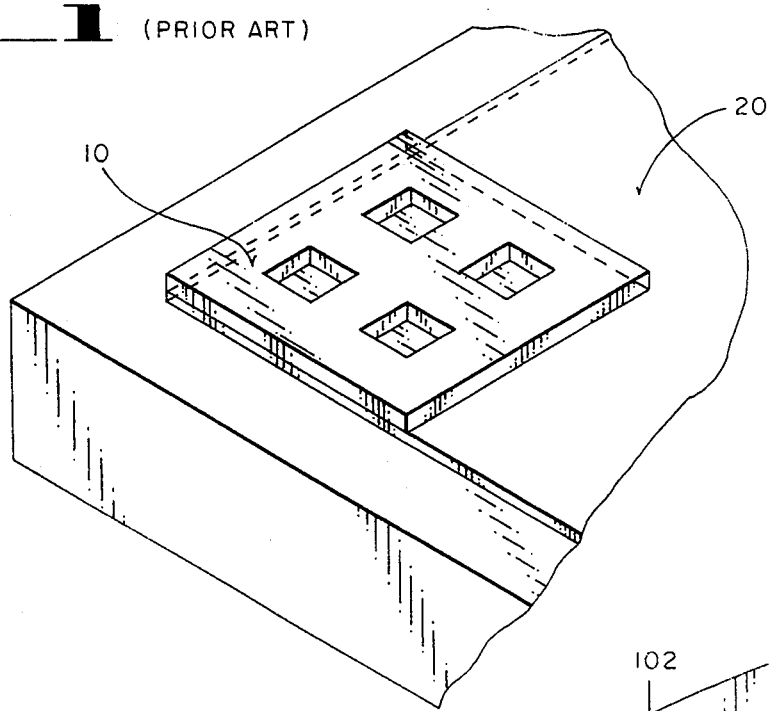
FIG_2
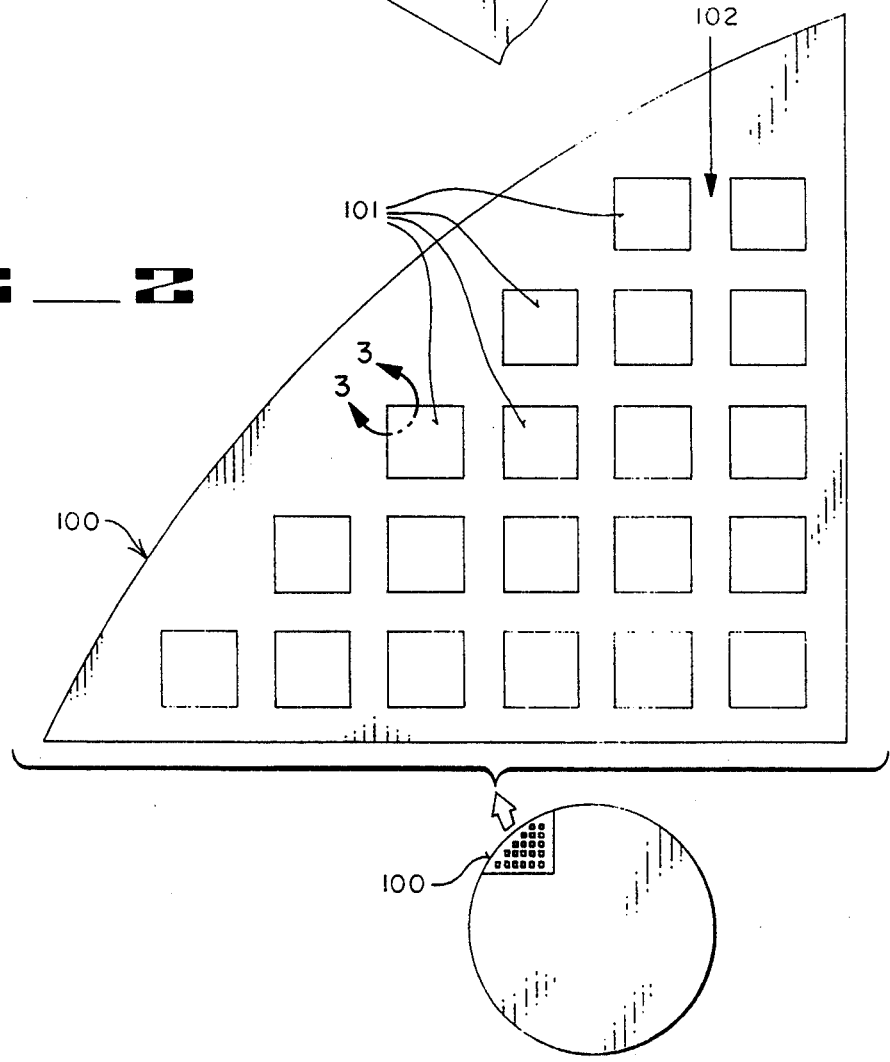

FIG_3
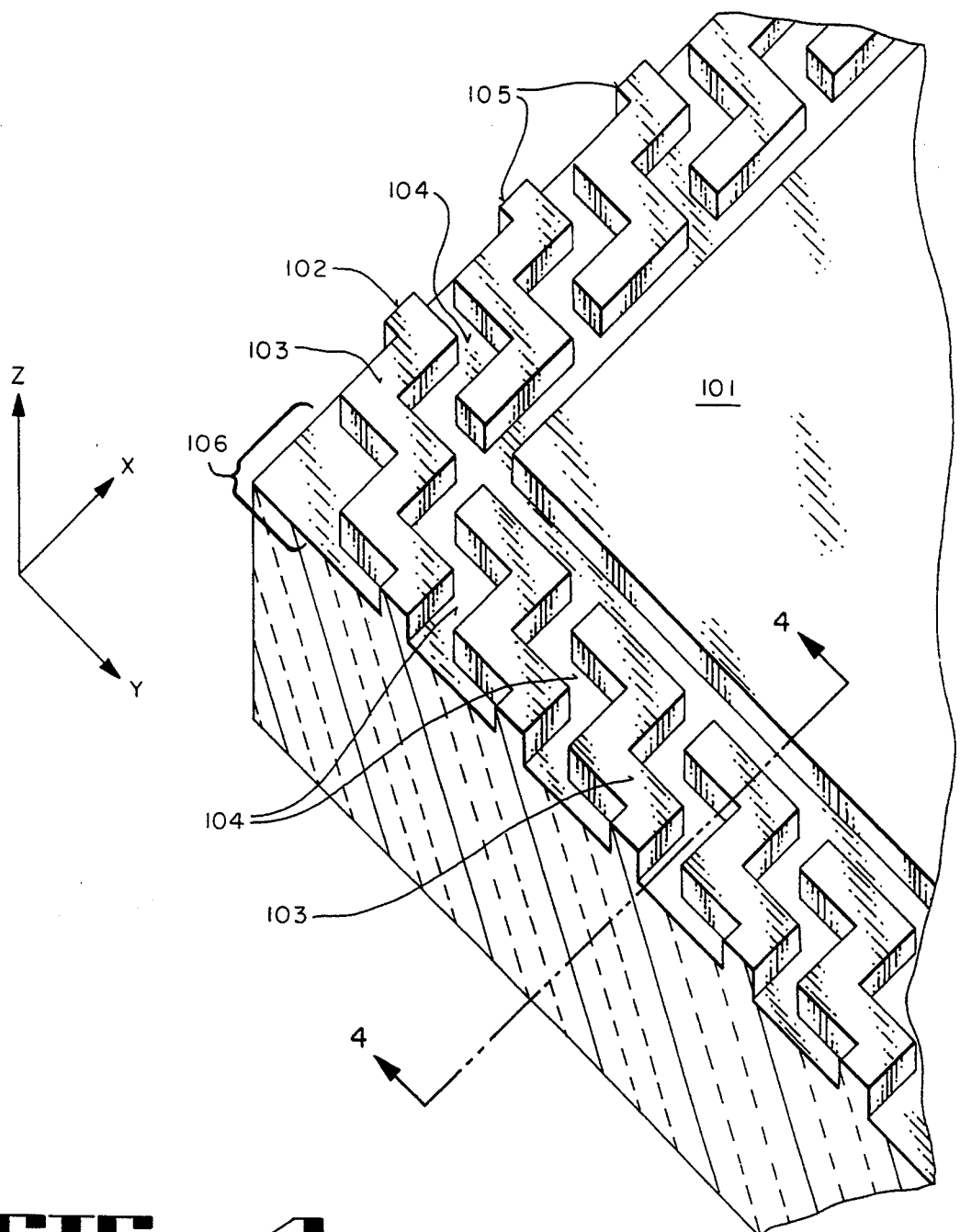
FIG_4
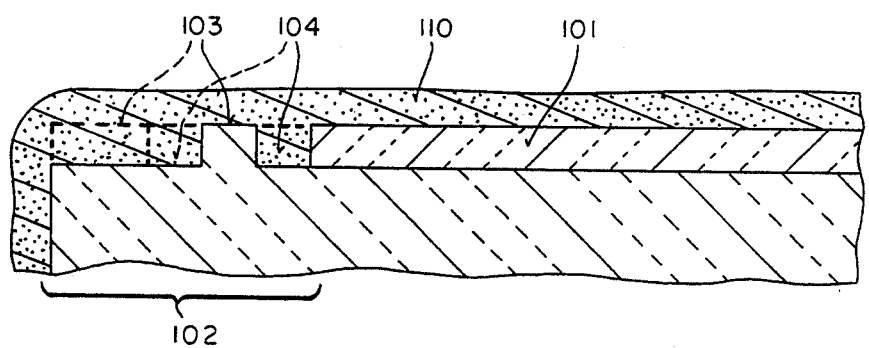

METHOD OF PRODUCING A SCRIBELINED LAYOUT STRUCTURE FOR PLASTIC ENCAPSULATED CIRCUITS this is a continuation of application Ser. No. 07/698,381, filed May 10, 1991.

FIELD OF THE INVENTION

The present invention pertains to the field of integrated circuit manufacturing techniques. Specifically, the present invention pertains to plastic encapsulated integrated circuits

BACKGROUND OF THE INVENTION

Plastic encapsulated integrated circuits have been found to suffer damage due to stresses caused by thermal expansion and contraction in the molding compound surrounding the integrated circuit. Stressing, resulting from temperature cycling of the chip and other thermal coefficient of expansion mismatches of the materials, causes mechanical stresses in the plastic encapsulated integrated circuits. The highest of these stresses occur near the corners of the encapsulated die. The mechanical force exerted on the corners of the die results in several types of damage in the die, which are discussed below. The amount of damage found in the integrated circuit is a partly a function of the layout strategy of the area near the corner of the die.

As a result of the thermal expansions and contractions and resulting mechanical stresses in the molding compound, delamination, or movement of the molding compound with respect to the surface of the die occurs. When the thermally induced stresses are great enough to produce fractures in the molding compound, the area of damage to the die may be increased, and thin film cracking on the die is possible. As might be expected, such damage to the die, as a result of the stress, can cause the performance of the plastic encapsulated integrated circuit device to suffer, or cause the entire circuit to fail.

Previous attempts to solve the problem of molding compound movement have focused on corner structures on the die composed of metal and contact layers. In such structures, metal and contact layers are placed onto the corner of the die to act as a bonding area for the molding compound, as will be shown in conjunction with FIG. 1. However, metal and contact layers have a limited depth or topological variance, and thus, a lower ability to lock the molding compound to the die. Additionally, the corner structures do not reduce the threat of mold compound fractures.

Another problem facing plastic encapsulated integrated circuits is delamination. Delamination occurs when the molding compound separates from the surface of the die. If delamination occurs, and the separation is large enough, the topological variations of the corner structures can no longer restrain the movement of the molding compound with respect to the die surface. When movement of the molding compound with respect to the surface of the encapsulated die occurs, thin film cracking as well as damage beyond the area covered by the corner structure is possible.

Attempts to alleviate the problem of molding compound movement by utilizing corner structures, have an additional drawback. Corner structures placed onto the surface of the die reduce the available active die area.

A method or means is needed which reduces molding compound fracturing, prevents movement of the molding compound with respect to the die surface, and does not require using active die space to achieve these results.

SUMMARY OF THE INVENTION

The present invention provides a method for reducing the fracturing of the molding compound used to encapsulate a die, and prevents movement of the molding compound with respect to the surface of the die without using active die space.

The present invention employs one or more mask layers used in the construction of the chip, and creates a series of surface features, such as "trenches", which may have depths of 6–8 microns or more. Such depths are considerably better than the 1–2 micron depths associated with earlier corner structure designs using metal alone or metal with a contact layer. The surface features are fabricated in the scribeline areas of the wafer surrounding the active dies. That is, the trenches reside outside of the active die area and do not require using valuable active die area on the corner of the die.

When a die is encapsulated by a molding compound, the molding compound spreads over the die and into the trenches created in the scribeline areas adjacent to the die. As the molding compound hardens, the compound is "locked" into the trenches and around the die.

The topological variances created by the trenches in the scribeline areas, allow the stresses present at the corner of the die to be spread out over several "stress relief points." With the stress spread out, there is less likelihood that the molding compound will fracture. By reducing molding compound fracturing, the movement of the molding compound is reduced and thin film cracking on the surface of the die is prevented. Additionally, should delamination occur, the increased depth of the scribeline surface features cause the molding compound to continue to be locked around the die thereby preventing further damage from occurring to the die.

By producing the surface features in the scribeline areas surrounding the dies, the loss of active die area can be alleviated and, as a result, allow for less expensive dies.

BRIEF DESCRIPTION OF THE DRAWINGS

FIG. 1 is an illustration of prior art in which structures are placed onto the corner of a die.

FIG. 2 is an illustration of a wafer containing individual dies and the adjacent scribeline areas.

FIG. 3 is a cross-sectional view of a single die and its adjacent areas which illustrates an example of a pattern produced in accordance with the present invention.

FIG. 4 is a cross-sectional elevation view illustrating an individual die which has been encapsulated by molding compound.

DETAILED DESCRIPTION OF THE PREFERRED EMBODIMENT

The present invention provides a method for preventing the fracturing of a compound used to encapsulate an integrated circuit and preventing movement of the molding compound with respect to the die surface without using active die space.

In the following description, numerous specific details are set forth in order to provide a more thorough understanding of the invention. However, it will be apparent to one with ordinary skill in the art that these specific details need not be used to practice the invention. Well known processing is not described in order not to unnecessarily obscure the present invention in detail.

As illustrated in FIG. 1, previous attempts to solve the problem of molding compound movement have required placing corner structures 10 onto the active die surface 20. As a result, the corners of the active die 20 were not available for use in circuit architecture. Additionally, if delamination between the molding compound and the die 20 should occur, the molding compound separates from the corner structures 10 and causes further damage to the die 20.

Referring now to FIG. 2, a wafer 100 containing individual circuits or dies 101 is shown. Although FIG. 2 is not drawn to scale, it illustrates and highlights the areas which are utilized by the present invention. The precise dimensions of the wafer 100, dies 101, and scribeline areas 102 are not critical to the present invention. After the dies 101 are fabricated onto the wafer 100, the dies 101 are separated from each other at the scribeline areas 102. The scribeline areas 102 are arranged on the wafer 100 similar to intersecting streets separating the dies 101. The dies 101 may be fabricated by processes well known in the art. The present invention utilizes the scribeline areas 102 between the individual dies 101.

As the dies 101 are fabricated, surface features such as trenches are produced in the scribeline areas 102. The trenches provide topological variance in the scribeline areas 102. The surface features may be designed to partially or completely surround the dies 101. Additionally, the surface features produced in the scribeline areas 102 may be produced such that they are only present in the scribeline areas surrounding the corners of the dies 101. Surface features produced in the scribeline areas are illustrated in FIG. 3. Surface features may also be produced by placing stacks of metal or polysilicon in the scribeline areas 102, instead of or in addition to using trenches. Additionally, topological variations may be produced by alternating trenches with thin film stacks. In the preferred embodiment of the present invention, the trenches produced in the scribeline areas 102 completely surround the dies 101, and are achieved through a combination of a wet etch and a plasma etch. However, the methods of the present invention are applicable with any of the numerous related processes well known in the art.

The present invention may be implemented using a variety of surface feature depths. It is possible to use masking layers to create trenches 104 which are extended farther into the wafer 100 than features used in the die 101. By using more than one masking layer, trenches 104 may be constructed which are greater than 6–8 microns in depth. The trenched areas 104 may also be produced such that only the top mask layer is used, resulting in trench depths of 6–8 microns. In the preferred embodiment of the present invention, the passivation or pad mask used in the fabrication of the dies 101 is also used to create the surface features in the scribeline areas 102. Accordingly, no additional process steps are needed for the present invention.

Referring to FIG. 3, the surface features produced in the scribeline areas 102, in the preferred embodiment of the invention, are designed such that the pattern will provide resistance to movement of the molding compound in both the "X" and "Y" direction in relation to the surface of the die 101, while tolerating some movement of the molding compound in the "Z" direction. By designing the surface features such that movement of a molding compound is restricted, many corners 105 are added which distribute stresses present at the corner of the die 101. The addition of the corners 105 by the surface features reduces the potential of mold compound fracturing and thus reduces the potential for thin film cracking.

As shown in FIG. 3, the surface features are designed and placed such that after the individual dies 101 are separated, the raised areas 103 are not coincident with the corner area 106 created as a result of the wafer-sawing process. That is, the raised areas 103 do not protrude into the corner region 106 of the surrounding scribeline areas 102. However, the methods of the present invention are applicable to varying placements of the raised areas 103, including placing the raised areas 103 into the corner region 106 of the scribeline areas 102.

The preferred embodiment of the present invention utilizes surface features which form a "tire tread" pattern as shown in FIG. 3. Additionally, the raised areas 103 and the trenched areas 104 are designed in the preferred embodiment in a ratio such that they each occupy approximately 50% of the scribeline areas 102. However, it will be obvious to one of ordinary skill in the art, that the methods of the present invention are applicable to any of numerous surface feature designs and ratios.

Referring now to FIG. 2, as the circuits or dies 101 are fabricated on the wafer 100, the surface features are simultaneously produced in the scribeline areas 102. The wafer 100 is then wafer-sawed such that the individual dies 101 are separated from each other. It will again be obvious to one of ordinary skill in the art that the dies 101 may be separated or broken apart using any of a wide range of separating techniques. The dies 101 are separated such that each die 101 is surrounded by a portion of the scribeline areas 102 containing the surface features illustrated in FIG. 3.

After the dies 101 have been fabricated and separated, the individual dies are encapsulated in a molding compound using any of the encapsulating techniques well known in the art. The encapsulation of the dies 101 and surrounding scribeline areas 102 is achieved in the preferred embodiment of the present invention through the injection of a liquified plastic type compound into a mold containing individual dies 101, however, the methods of the present invention are equally applicable to other type of molding compounds or encapsulation techniques.

Referring now to FIG. 4, as the molding compound 110 surrounds the scribeline areas 102, the compound covers the raised areas 103, fills the trenches 104, and conforms to the shape of the surface features to submicron levels. The trenches 104, raised areas 103, and corners 105 present in the scribeline areas 102, lock the molding compound 110 around the die 101 as the molding compound 110 hardens. As stated above, the surface features are designed to provide resistance to movement of the molding compound 110 in both the "X" and "Y" direction in relation to the die 101, while tolerating some "Z" direction movement. The surface features also provide stress relief points to dissipate the mechanical stresses between the molding compound and the die 101. That is, as the die 101 and the molding compound 110 experience expansion and contraction due to thermal variances and thermal coefficient of expansion mismatches, the resulting mechanical stresses are divided between the additional surface features thus lowering the concentration of stress present at the corner of the die 101. By reducing the stress, the molding compound 110 will have a lower probability of fracturing, thus, further damage in the form of thin film cracking is prevented.

In the event that delamination between the molding compound 110 and the die 101 occurs, the molding compound 110 still remains locked into the trenches 104 in the scribeline areas 102. With the molding compound 110 firmly locked around the die 101, movement of the molding compound 110 with respect to the surface of the die 101, and subsequent damage to the die 101, is prevented.

Thus, a method which reduces molding compound fracturing, prevents movement of the molding compound with respect to the surface of the die, and does not require using active die space is shown.

What is claimed is:

1. A method for reducing fracturing of molding compound surrounding an encapsulated integrated circuit die and preventing the movement of said molding compound with respect to the surface of said integrated circuit die, said method comprising the steps of:
    a) producing a plurality of surface features in the scribeline areas of a wafer adjacent to said die, such that said plurality of surface features have topological variance;
    b) separating said wafer into individual dies such that said plurality of surface features remain adjacent to said die:
    c) encapsulating said die with said molding compound such that said molding compound extends into and makes contact with said surface features present in said scribeline areas, thereby locking said molding compound around said die and further wherein the step of producing surface features includes the step of producing a plurality of trenches etched into said scribeline areas in patterns designed such that said molding compound locks said die in both the x and y directions along the surface of said die when said die is encapsulated with said molding; and wherein said trenches are arranged in patterns such that additional corners are produced in said scribeline areas to alleviate stresses in said molding compound.

2. A method for reducing fracturing of molding compound surrounding an encapsulated integrated circuit die and preventing the movement of said molding compound with respect to the surface of said integrated circuit die, said method comprising the steps of:
    a) producing a plurality of surface features in the scribeline areas of a wafer adjacent to said die, such that said plurality of surface features have topological variance:
    b) separating said wafer into individual dies such that said plurality of surface features remain adjacent to said die:
    c) encapsulating said die with said molding compound such that said molding compound extends into and makes contact with said surface features present in said scribeline areas, thereby locking said molding compound around said die, and further wherein the step of producing surface features includes the step of producing a plurality of trenches etched into said scribeline areas by use of a mask when fabricating said die; wherein said plurality of trenches are arranged in patterns designed such that said molding compound locks said die in both the x and y directions along the surface of said die; and wherein said trenches are arranged in patterns such that additional corners are produced in said scribeline areas to alleviate stresses in said molding compound.

3. A process for reducing stress on an encapsulated integrated circuit die and preventing the movement of a molding compound on said encapsulated integrated circuit die with respect to the surface of said integrated circuit die comprising the steps of:
    a) producing a plurality of surface features having a plurality of corners in the scribeline areas of a wafer adjacent to said die wherein said plurality of surface features have topological variance;
    b) separating said wafer into individual dies such that said plurality of surface features remain adjacent to said die; and
    c) encapsulating said die with said molding compound such that said molding compound extends in and makes contact with said surface features present in said scribeline areas to lock said molding compound around said die, wherein said corners distribute the stress, and further wherein the step of producing includes the step of producing said topological variances of said surface features such that said surface features produced in said scribeline areas comprise a plurality of trenches etched into said scribeline areas and arranged in patterns designed such that said molding compound locks said die in both the x and y directions along the surface of said die; and wherein said plurality of trenches are arranged in patterns such that additional corners are produced in said scribeline areas to alleviate stresses in said molding, such that the stress on said die is reduced.

4. A process for reducing stress on an encapsulated integrated circuit die and preventing the movement of a molding compound on said encapsulated integrated circuit die with respect to the surface of said integrated circuit die comprising the steps of;
    a) producing a plurality of surface features having a plurality of corners in the scribeline areas of a wafer adjacent to said die wherein said plurality of surface features have topological variance;
    b) separating said wafer into individual dies such that said plurality of surface features remain adjacent to said die; and
    c) encapsulating said die with said molding compound such that said molding compound extends in and makes contact with said surface features present in said scribeline areas to lock said molding compound around said die, wherein said corners distribute the stress, wherein the step of producing includes the step of producing said topological variances of said surface features such that said surface features produced in said scribeline areas comprise a plurality of trenches etched into said scribeline areas using a mask when fabricating said die; wherein said plurality of trenches are arranged in patterns designed such that said molding compound locks said die in both the x and y directions along the surface of said die; and wherein said plurality of trenches are arranged in patterns such that additional corners are produced in said scribeline areas to alleviate stresses in aid molding compound, such that the stress on said die is reduced.

* * * * *

UNITED STATES PATENT AND TRADEMARK OFFICE
CERTIFICATE OF CORRECTION

PATENT NO. : 5,336,456
DATED : August 9, 1994
INVENTOR(S) : Steven R. Eskildsen, et al.

It is certified that error appears in the above-indentified patent and that said Letters Patent is hereby corrected as shown below:

Scribelined Layout Structure For Plastic Encapsulated Integrated Circuits--

Column 1, Line 44;    Delete "comer";    Insert in place thereof --corner--

Column 1, Line 47;    Delete "comer";    Insert in place thereof --corner--

Column 1, Line 52;    Delete "comer";    Insert in place thereof --corner--

Column 1, Line 58;    Delete "comer";    Insert in place thereof --corner--

Column 1, Line 64;    Delete "comer";    Insert in place thereof --corner--

Column 1, Line 66;    Delete "comer";    Insert in place thereof --corner--

Column 1, Line 67;    Delete "comer";    Insert in place thereof --Corner--

Column 2, Line 23;    Delete "comer";    Insert in place thereof --corner--

UNITED STATES PATENT AND TRADEMARK OFFICE
CERTIFICATE OF CORRECTION

PATENT NO. : 5,336,456
DATED : August 9, 1994
INVENTOR(S) : Steven R. Eskildsen, et al.

It is certified that error appears in the above-indentified patent and that said Letters Patent is hereby corrected as shown below:

Column 2, Line 31;     Delete "comer";     Insert in place thereof -- corner--

Column 3, Line 8;     Delete "comer";     Insert in place thereof -- corner--

Column 3, Line 9;     Delete "comer";     Insert in place thereof -- corner--

Column 3, Line 13;     Delete "comer";     Insert in place thereof -- corner--

Column 3, Line 36;     Delete "comers"     Insert in place thereof -- corners--

Column 4, Line 4;     Delete "comers"     Insert in place thereof -- corners--

UNITED STATES PATENT AND TRADEMARK OFFICE
CERTIFICATE OF CORRECTION

PATENT NO. : 5,336,456
DATED : August 9, 1994
INVENTOR(S) : Steven R. Eskildsen, et al.

It is certified that error appears in the above-indentified patent and that said Letters Patent is hereby corrected as shown below:

Column 4, Line 5; Delete "comer"; insert in place thereof--corner--

Signed and Sealed this

Twenty-sixth Day of December, 1995

Attest:

BRUCE LEHMAN

Attesting Officer     Commissioner of Patents and Trademarks